United States Patent
Le et al.

(10) Patent No.: US 11,528,168 B2
(45) Date of Patent: Dec. 13, 2022

(54) METHODS, SYSTEMS AND APPARATUS FOR HYBRID SIGNAL PROCESSING FOR PULSE AMPLITUDE MODULATION

(71) Applicant: SITRUS TECHNOLOGY CORPORATION, Shanghai (CN)

(72) Inventors: Michael Q. Le, Laguna Niguel, CA (US); Jorge Antonio Casanova, Daly City, CA (US)

(73) Assignee: SITRUS TECHNOLOGY CORPORATION, Shanghai (CN)

( * ) Notice: Subject to any disclaimer, the term of this patent is extended or adjusted under 35 U.S.C. 154(b) by 128 days.

(21) Appl. No.: 16/984,096

(22) Filed: Aug. 3, 2020

(65) Prior Publication Data

US 2021/0036900 A1 Feb. 4, 2021

Related U.S. Application Data

(60) Provisional application No. 62/882,463, filed on Aug. 2, 2019.

(51) Int. Cl.
*H04L 25/03* (2006.01)
*H03M 1/06* (2006.01)

(52) U.S. Cl.
CPC .... *H04L 25/03057* (2013.01); *H03M 1/0624* (2013.01); *H04L 25/03885* (2013.01); *H04L 2025/0349* (2013.01)

(58) Field of Classification Search
CPC ....... H04L 2025/0349; H04L 25/03057; H04L 25/03885; H03M 1/0624

(Continued)

(56) References Cited

U.S. PATENT DOCUMENTS 10,728,059 B1 * 7/2020 Sun .................. H04L 25/03057
2014/0169440 A1    6/2014 Kotagiri et al.
(Continued)

FOREIGN PATENT DOCUMENTS

CN   102299877 A   12/2011
CN   102882817 A    1/2013
CN   107925641 A    5/2021

OTHER PUBLICATIONS

First Office Action dated Oct. 21, 2021, to CN Patent Application No. 202080005358.7.

*Primary Examiner* — Leila Malek
(74) *Attorney, Agent, or Firm* — Hauptman Ham, LLP (57) ABSTRACT

A method to implement hybrid signal processing includes steps for receiving an analog signal at a receiver frontend, sampling the received analog signal and storing the analog sampled signals using a plurality of sampling circuitries inside the receiver frontend. Then, processing the plurality of analog sampled signals using interleaved feed-forward equalizers (FFEs) to provide FFE interleaved sampled signal values corresponding to each of the sampling circuitries. Then, processing the analog sampled signals at an interleaved Decision Feedback Equalizer (DFE) to obtain DFE interleaved sampled signal values, summing each of the FFE interleaved sampled signal values with output from one of the DFE interleaved sampled signal values to provide equalizer output signal values, and digitizing the equalizer output signal values to provide digital data bits corresponding to each of the equalizer output signal values. Implementations of the method as a hybrid communication system, system-on-a-chip, and computer readable memory are also disclosed.

33 Claims, 7 Drawing Sheets

(58) Field of Classification Search
USPC .......................................................... 375/233
See application file for complete search history.

(56) References Cited

U.S. PATENT DOCUMENTS

2014/0269889 A1    9/2014  Xu et al.
2016/0277219 A1*   9/2016  Venkatram ........ H04L 25/03878
2017/0295039 A1*  10/2017  Hidaka ............. H04L 25/03267

* cited by examiner

METHODS, SYSTEMS AND APPARATUS FOR HYBRID SIGNAL PROCESSING FOR PULSE AMPLITUDE MODULATION

RELATED APPLICATIONS

This application claims priority to U.S. Provisional Application 62/882,463 that was filed on Aug. 2, 2019 and which is fully incorporated herein by reference.

FIELD OF THE INVENTION

The instant disclosure generally relates to methods, systems and apparatus for hybrid signal processing. In one embodiment, the disclosure relates to methods, systems and apparatus for signal processing in pulse amplitude modulation ("PAM") for CMOS PAM communication.

BACKGROUND OF THE INVENTION

Pulse-amplitude modulation ("PAM"), is a form of signal modulation where the message information is encoded in the amplitude of a series of signal pulses. It is an analog pulse modulation scheme in which the amplitudes of a train of carrier pulses are varied according to the sample value of the message signal. Demodulation is performed by detecting the amplitude level of the carrier at every single period.

As Internet bandwidth demand increases and mobile phone connectivity advances to 5G, higher transmission speeds are needed for mobile data communications, particularly fiber-optic communications from cell towers to base stations, and within data centers for data center interconnects (DCI) and other inter-device communications. A conventional digital communication system uses an NRZ or PAM2 scheme to modulate signals so that bits of information are represented by one of two possible signal levels that correspond to a binary 0 or 1. To increase the bit rate, the PAM4 scheme has been proposed, to modulate signals so that bits are represented by one of four possible signal levels corresponding to binary 00, 01, 10 or 11. The PAM4 scheme thus effectively doubles the bit rate in serial data transmissions by increasing the number of levels of pulse-amplitude modulation, but it does so at the cost of noise susceptibility, with signal-to-noise ratios dropping by a factor of about two thirds.

A high-speed optical PAM4 system transmitting, e.g., at 56 Gb/s therefore requires complex digital signal processing (DSP) to enable operation in circuits having lower signal-to-noise ratios. Practical implementation of such as system is made possible only by modern CMOS technology due to integration, cost, and power constraints. Advanced design in this field envisions the integration of a PAM4 laser driver on a CMOS chip.

Accordingly, there is a need for improved and efficient signal processing for a received PAM signal.

SUMMARY OF THE INVENTION

The disclosed embodiments provide methods, systems and apparatus for hybrid signal processing. In one embodiment, the disclosure relates to methods, systems and apparatus for signal processing in pulse amplitude modulation ("PAM") for CMOS PAM communication.

In one embodiment, the disclosure provides an efficient method to implement hybrid signal processing (use analog and digital signal processing) for PAM signals, using analog feed forward equalizer (FFE) and decision feedback equalizer (DFE) for pulse amplitude modulated (PAM) signals along with an analog to digital converter (ADC).

In one embodiment, the disclosure provides a method to implement hybrid signal processing, the method comprising: receiving an analog signal at a receiver frontend; sampling the received analog signal and storing the analog sampled signals using a plurality of sampling circuitries inside the receiver frontend; processing the plurality of analog sampled signals at a plurality of interleaved feed-forward equalizers (FFEs) to provide a plurality of FFE interleaved sampled signal values corresponding to each of the plurality of the sampling circuitries; processing the plurality of analog sampled signals at an interleaved Decision Feedback Equalizer (DFE) to obtain a plurality of DFE interleaved sampled signal values; summing each of the FFE interleaved sampled signal values with a corresponding output from one of the DFE interleaved sampled signal values to provide a plurality of equalizer output signal values; digitizing the plurality of equalizer output signals to provide a digital data bits corresponding to each of the plurality of equalizer output signal value.

In still another embodiment, the disclosure relates to a non-transitory medium for storing instructions, executable on a processor, which when executed cause the processor to implement hybrid signal processing by implementing steps comprising: receiving an analog signal at a receiver frontend; sampling the received analog signal and storing the analog sampled signals using a plurality of sampling circuitries inside the receiver frontend; processing the plurality of analog sampled signals at a plurality of interleaved feed-forward equalizers (FFEs) to provide a plurality of FFE interleaved sampled signal values corresponding to each of the plurality of the sampling circuitries; processing the plurality of analog sampled signals at an interleaved Decision Feedback Equalizer (DFE) to obtain a plurality of DFE interleaved sampled signal values; summing each of the FFE interleaved sampled signal values with a corresponding output from one of the DFE interleaved sampled signal values to provide a plurality of equalizer output signal values; digitizing the plurality of equalizer output signals to provide a digital data bits corresponding to each of the plurality of equalizer output signal value.

In another embodiment, the disclosure relates to an apparatus for implementing the exemplary method described above in the form of a hybrid communication system. One such exemplary hybrid communication system includes a receiver frontend to receive an analog signal; a plurality of sampling circuities to sample the received analog signal; a plurality of interleaved feed-forward equalizers (FFEs) to receive and process the analog sampled signals to provide a plurality of FFE interleaved sampled signal values corresponding to each of the plurality of the sampling circuitries; an interleaved Decision Feedback Equalizer (DFE) to process the plurality of analog sampled signals to obtain a plurality of DFE interleaved sampled signal values; a summer to sum each of the FFE interleaved sampled signal values with a corresponding output from one of the DFE interleaved sampled signal values to provide a plurality of equalizer output signal values; and an analog-to-digital converter (ADC) to digitize the plurality of equalizer output signals to provide digital data bits corresponding to each of the plurality of equalizer output signal values. In another embodiment, the hybrid communication system may be implemented as a System-On-A-Chip.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the disclosure, and be protected by the accompanying claims. Component parts shown in the drawings are not necessarily to scale, and may be exaggerated to better illustrate the important features of the disclosure. Dimensions shown are exemplary only. In the drawings, like reference numerals may designate like parts throughout the different views, wherein:

DETAILED DESCRIPTION OF THE INVENTION

The disclosed embodiments provide methods, systems and apparatus for hybrid signal processing. In one embodiment, the disclosure relates to methods, systems and apparatus for signal processing in pulse amplitude modulation ("PAM") for CMOS PAM communication.

In one embodiment, the disclosure provides an efficient method to implement hybrid signal processing (use analog and digital signal processing) for PAM signals, using analog feed forward equalizer (FFE) and decision feedback equalizer (DFE) for pulse amplitude modulated (PAM) signals along with an analog to digital converter (ADC).

In another embodiment, the disclosure provides a method to implement hybrid signal processing, the method comprising: receiving an analog signal at a receiver frontend; sampling the received analog signal and storing the analog sampled signals using a plurality of sampling circuitries inside the receiver frontend; processing the plurality of analog sampled signals at a plurality of interleaved feed-forward equalizers (FFEs) to provide a plurality of FFE interleaved sampled signal values corresponding to each of the plurality of the sampling circuitries; processing the plurality of analog sampled signals at an interleaved Decision Feedback Equalizer (DFE) to obtain a plurality of DFE interleaved sampled signal values; summing each of the FFE interleaved sampled signal values with a corresponding output from one of the DFE interleaved sampled signal values to provide a plurality of equalizer output signal values; digitizing the plurality of equalizer output signals to provide digital data bits corresponding to each of the plurality of equalizer output signal values.

In still another embodiment, the disclosure relates to a non-transitory medium for storing instructions, executable on a processor, which when executed cause the processor to implement hybrid signal processing by implementing steps comprising: receiving an analog signal at a receiver frontend; sampling the received analog signal and storing the analog sampled signals using a plurality of sampling circuitries inside the receiver frontend; processing the plurality of analog sampled signals at a plurality of interleaved feed-forward equalizers (FFEs) to provide a plurality of FFE interleaved sampled signal values corresponding to each of the plurality of the sampling circuitries; processing the plurality of analog sampled signals at an interleaved Decision Feedback Equalizer (DFE) to obtain a plurality of DFE interleaved sampled signal values; summing each of the FFE interleaved sampled signal values with a corresponding output from one of the DFE interleaved sampled signal values to provide a plurality of equalizer output signal values; digitizing the plurality of equalizer output signals to provide digital data bits corresponding to each of the plurality of equalizer output signal values.

In another embodiment, the disclosure relates to an apparatus for implementing the exemplary method described above in the form of a hybrid communication system. One such exemplary hybrid communication system includes a receiver frontend to receive an analog signal; a plurality of sampling circuities to sample the received analog signal; a plurality of interleaved feed-forward equalizers (FFEs) to receive and process the analog sampled signals to provide a plurality of FFE interleaved sampled signal values corresponding to each of the plurality of the sampling circuitries; an interleaved Decision Feedback Equalizer (DFE) to process the plurality of analog sampled signals to obtain a plurality of DFE interleaved sampled signal values; a summer to sum each of the FFE interleaved sampled signal values with a corresponding output from one of the DFE interleaved sampled signal values to provide a plurality of equalizer output signal values; and an analog-to-digital converter (ADC) to digitize the plurality of equalizer output signals to provide digital data bits corresponding to each of the plurality of equalizer output signal values.

Figure 1:
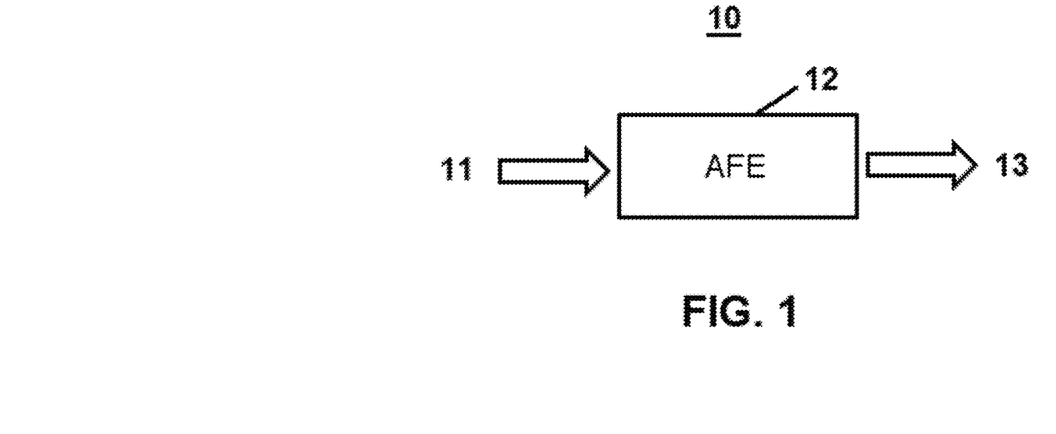
FIG. 1 is a block diagram illustrating a scheme for sampling an analog signal by a sampler residing in an analog front-end portion of a receiver.
Figure 2:
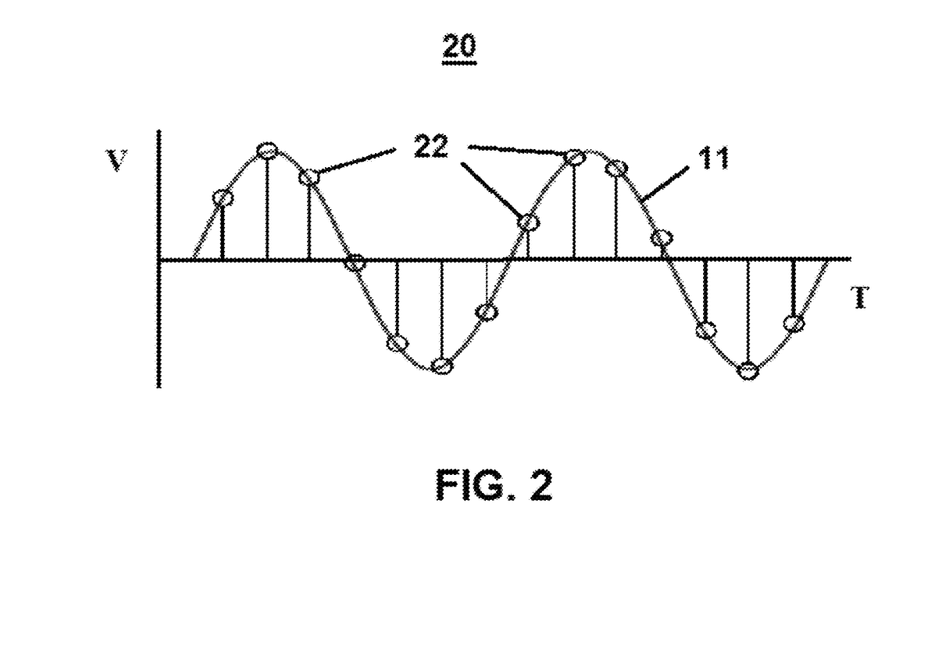
FIG. 2 is a graphical representation of an analog signal being sampled by an AFE.

FIG. 1 shows a block diagram illustrating a scheme 10 for sampling an analog signal 11 in an analog front-end (AFE) portion 12 of a receiver. A sampler normally resides in the AFE. The sampler is an essential building block for processing analog signals. The sampler takes a snapshot of the continuous-time signal at fixed intervals in time. Once the signal is sampled, the sampled signal 13 at the AFE output can be processed using discrete-time signal processing in both the analog and digital domain, i.e. using a hybrid scheme. The interval at which the input signal is sampled is called the sampling rate, i.e., 1 sample every 40 picoseconds is 25G samples per second (25 GS/s). FIG. 2 shows a graphical representation of an analog signal 11 being sampled by the AFE 12 at regular time intervals, to obtain sampled points 22 that make up the sampled signal 13.

Figure 3:
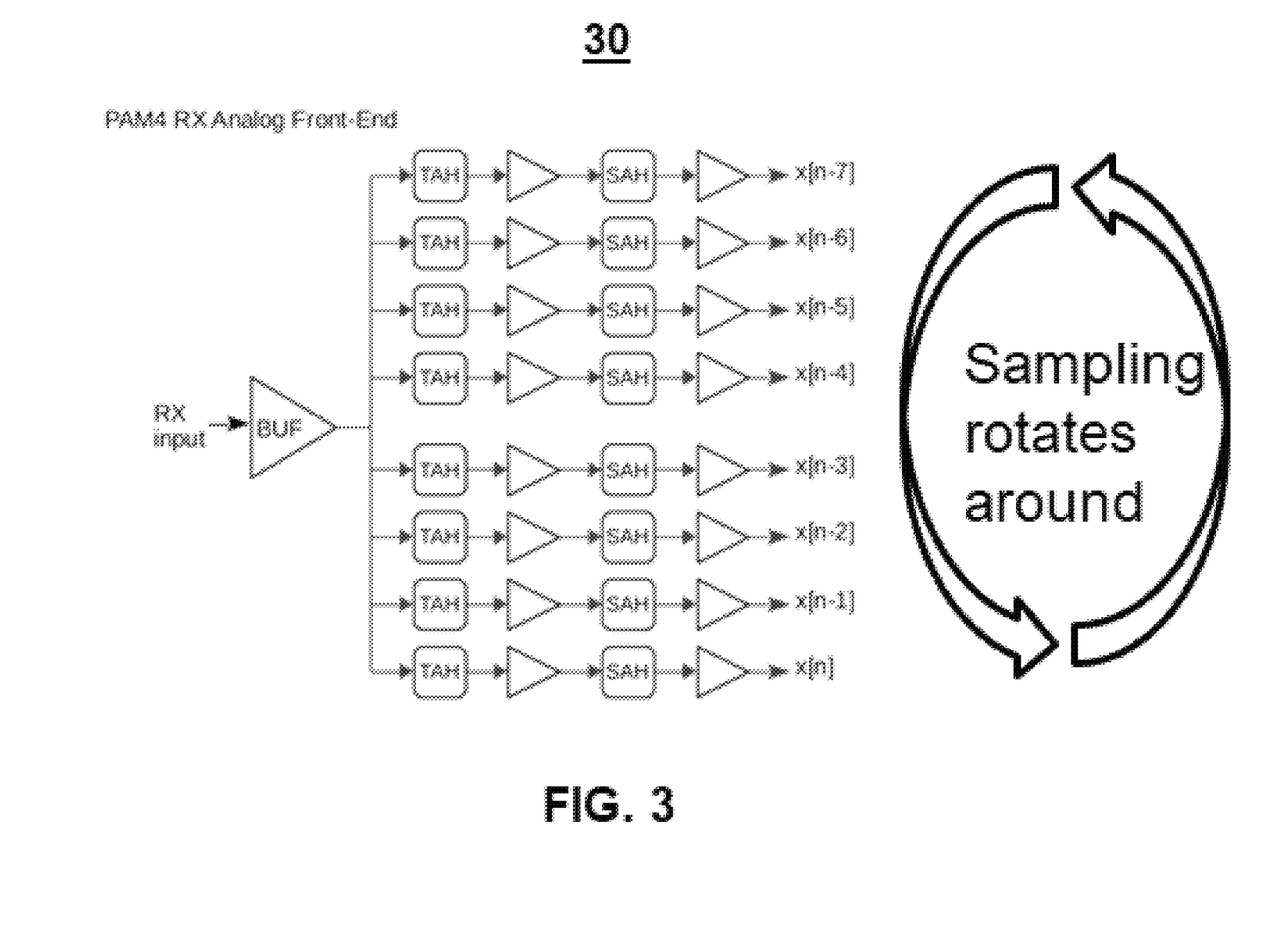
FIG. 3 is an exemplary illustration of an interleaved sampling according to one embodiment of the invention.

FIG. 3 provides an exemplary illustration of an interleaved sampling scheme 30 according to one embodiment of the invention. In general, a sampler may be referred to as a track and hold (TAH) or as a sample and hold (SAH). When a TAH is followed by a SAH, the technique is referred to as Master/Slave sampling. According to the present invention, this configuration is used in conjunction with interleaving, where multiple TAH/SAH circuits are used in parallel to sample the input signal at a higher aggregate data rate. The sampling rotates around, as indicated in the figure, so that the last eight samples of the input signal are held in a TAH/SAH array, as shown, which allows for more taps in the feed-forward equalizer implementation.

Figure 4:
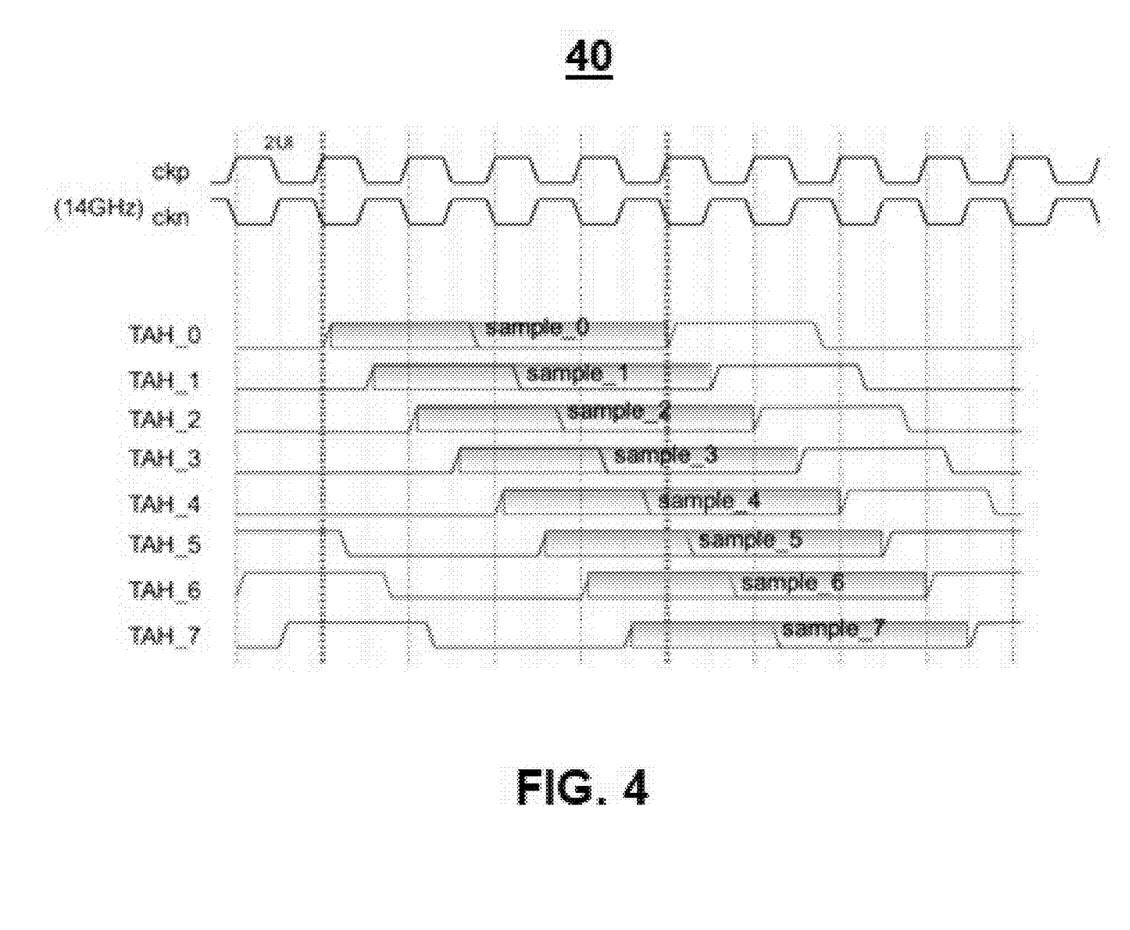
FIG. 4 is a timing diagram showing an interleaved master/slave clocking scheme for an application of the inventive embodiments.

FIG. 4 is a timing diagram showing an interleaved master/slave clocking scheme 40 for an application of the inventive embodiments. As indicated in the diagram, each TAH/SAH circuit samples the input signal at a rate of once every eight samples, with each sampling offset in time by one sample interval. This configuration gives an aggregate sampling rate that is 8 times higher than the sample rate of each individual TAH/SAH circuit. The TAH tracks the analog input signal when the clock is high and then holds the value when the clock is low. By using a SAH after the TAH circuit, the burden of having to "track" a fast moving analog signal is alleviated because the SAH circuit "samples" the signal being held by the TAH. Thus, the end result is more accurately termed sample-and-hold, rather than track-and-hold.

Figure 5:
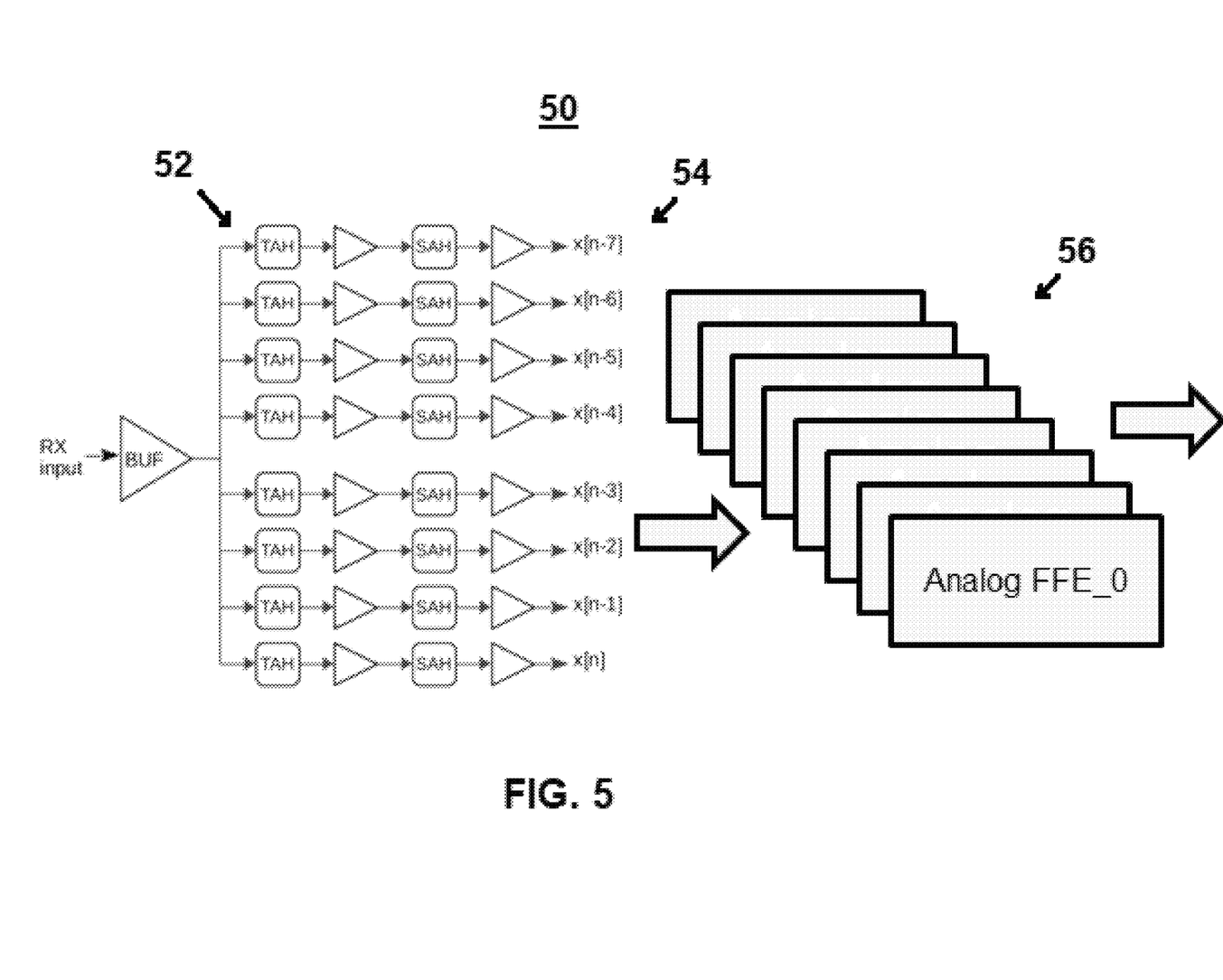
FIG. 5 is a block diagram showing a portion of digital signal processing module having an interleaved analog discrete-time feed-forward equalizer (FFE) according to one embodiment of the invention.

FIG. 5 is a block diagram showing a portion of digital signal processing module 50 having an interleaved analog discrete-time feed-forward equalizer (FFE) according to one embodiment of the invention. A PAM4 Receiver AFE 52 is shown on the left-hand side of the diagram. Use of the interleaving and master/slave configuration allows the 8 held values 54 in the SAH to be used to process the sampled signals by means of an analog discrete-time feed-forward equalizer (FFE) 56. The FFE 56 output is a weighted sum of the samples from the AFE 52. In this exemplary embodiment, eight interleaved FFE's are configured in parallel to achieve the signal processing. Interleaving advantageously allows the use of "slower" circuits to process the input signal (in parallel) for practical implementations where the circuits cannot be built fast enough using current available fabrication technology. The expression for the output of the Analog FFE 56 blocks may be given by the following equations, where (*) denotes multiplication:

FFE_0 output=$B0*x[n]+B1*x[n-1]+B2*x[n-2]+B3*x[n-3]+ \ldots$

FFE_1 output=$B0*x[n-1]+B1*x[n-2]+B2*x[n-3]+B3*x[n-4]+ \ldots$ (etc.)

Figure 6:
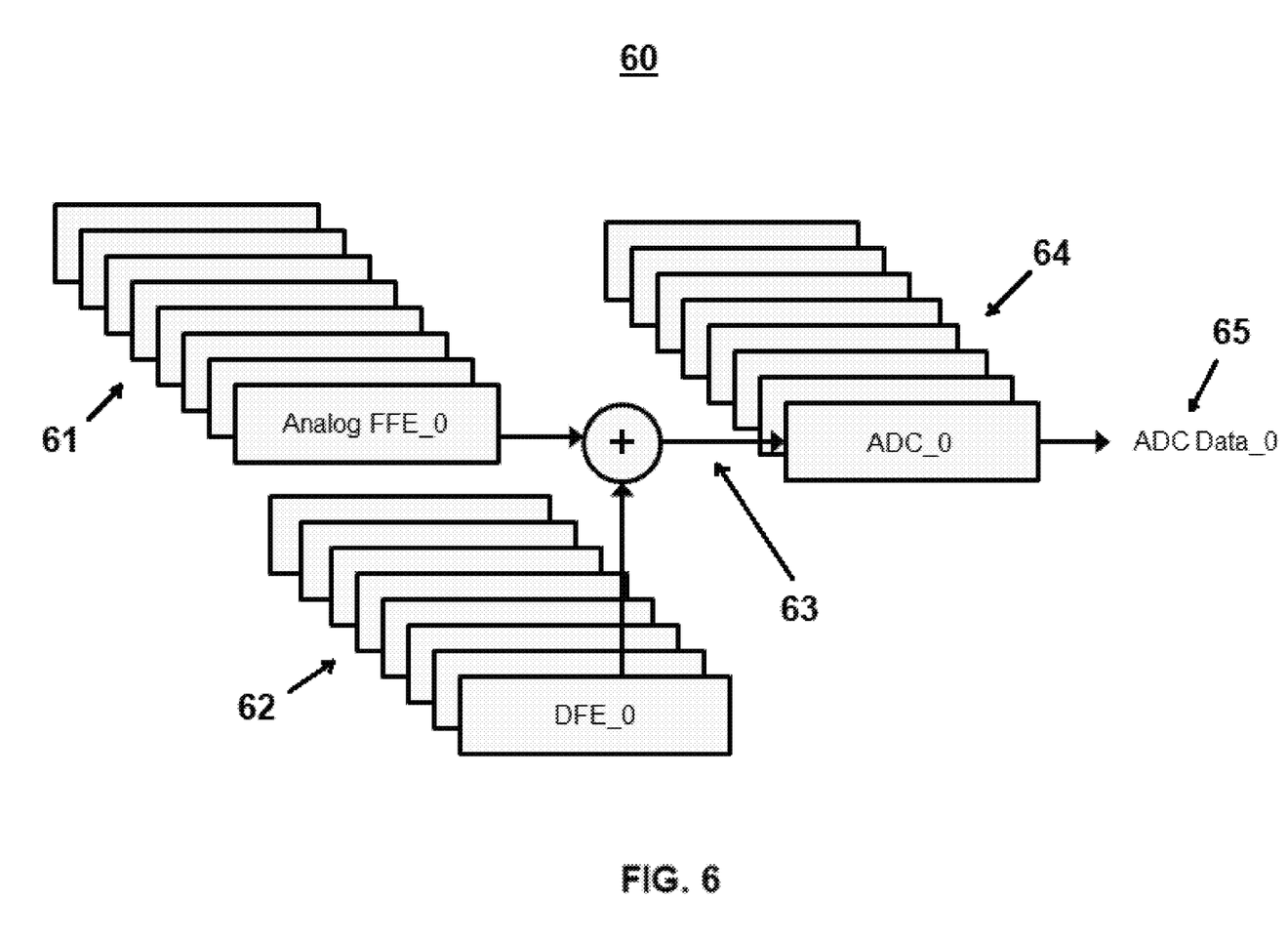
FIG. 6 shows a block diagram to illustrate hybrid signal processing according an embodiment of the invention.

FIG. 6 shows a block diagram to illustrate a hybrid signal processing scheme 60 in another embodiment of the invention. Here, the analog signal 61 is further processed using an interleaved DFE 62. Equalizer output 63 can be expressed as:

EQ_0 output=FFE_0_out+DFE_0_out

EQ_1 output=FFE_1_out+DFE_1_out (etc.)

The equalizer output 63 is then processed using an interleaved M-bit ADC 64 (one for each interleaved analog EQ). M can be any number of bits, though in this exemplary embodiment M is equal to 3. The ADC Data 65 can then be further processed in the digital domain using digital signal processing (DSP) to give the PAM data and other useful information.

In a conventional PAM4 DFE, multiplications are normally required to compute the DFE output as shown in the following equations, where (*) denotes multiplication:

DFE_0 output=$C0*d[n]+C1*d[n-1]+C2*d[n-2]+C3*d[n-3]+ \ldots$

DFE_1 output=$C0*d[n-1]+C1*d[n-2]+C2*d[n-3]+C3*d[n-4]+ \ldots$ (etc.)

Since the decisions d[n-k] have only 4 discrete values (+3, +1, -1, -3), a multiplexer (MUX) may be used in place of a multiplication circuit that would impose a high power consumption. For PAM4 decisions, the coefficient Ck needs to be multiplied by +3, +1, -1, or -3. The value 3*Ck can be generated by using 2*Ck+Ck. In the digital domain, multiplying by 2 is simply shifting the bits by one position and adding a "0" at the end, which is efficient to implement in hardware, i.e. 2*4=0010*0100=1000. Negating a value (multiple by -1) is a trivial digital operation to implement. A "hybrid" DFE may therefore be employed since the output value is an analog voltage or current, whereas the Ck*d[n-k] products are computed in the digital domain.

Figure 7:
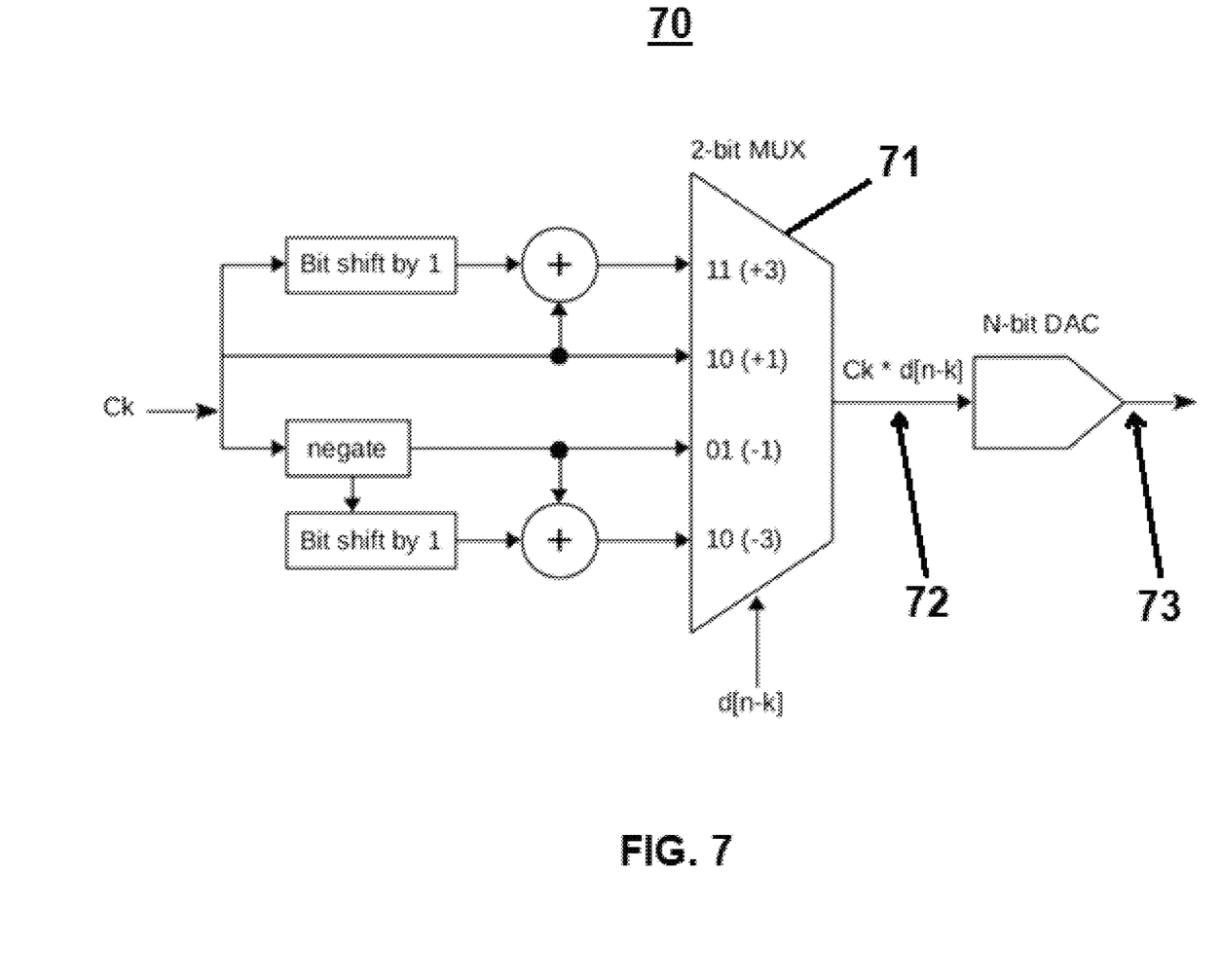
FIG. 7 shows a block diagram of an exemplary PAM4 DFE according to one embodiment of the invention.

FIG. 7 shows a block diagram of an exemplary PAM4 DFE 70 according to one embodiment of the invention. Here, since the decisions d[n-k] have only 4 discrete values (+3, +1, -1, -3), and so according to the present invention a 2-bit MUX 71 can be used in place of a multiplication circuit that would impose a high power consumption. The signal 72 at the output of the MUX 71 is a digital domain representation of Ck*d[n-k]. The signal 73 at the output of the N-bit DAC is an analog representation of Ck*d[n-k]. Summing analog currents can be achieved by tying the wires together to form the DFE output.

In an embodiment of an efficient LUT-based PAM4 DFE, the DFE_0 output equals the value stored at an address defined by d[n-1], d[n-2], d[n-3] as represented in the Table below:

| d[n − 1] | d[n − 2] | d[n − 3] | Output |
| --- | --- | --- | --- |
| 00 | 00 | 00 | Value_0 |
| 00 | 00 | 01 | Value_1 |
| 00 | 00 | 10 | Value_2 |
| 00 | 00 | 11 | Value_3 |
| 00 | 01 | 00 | Value_4 |
| 00 | 01 | 01 | Value_5 |
| ... | | | |

This scheme can be extended to using a larger MUX, which is controlled by more than one past decision, d[n-1], d[n-2], etc. so that the DFE becomes a look-up table (LUT). Note that each entry in the Output column (Value_#) stores the pre-computed DFE output for a given combination of d[n-k] decisions.

Figure 8:
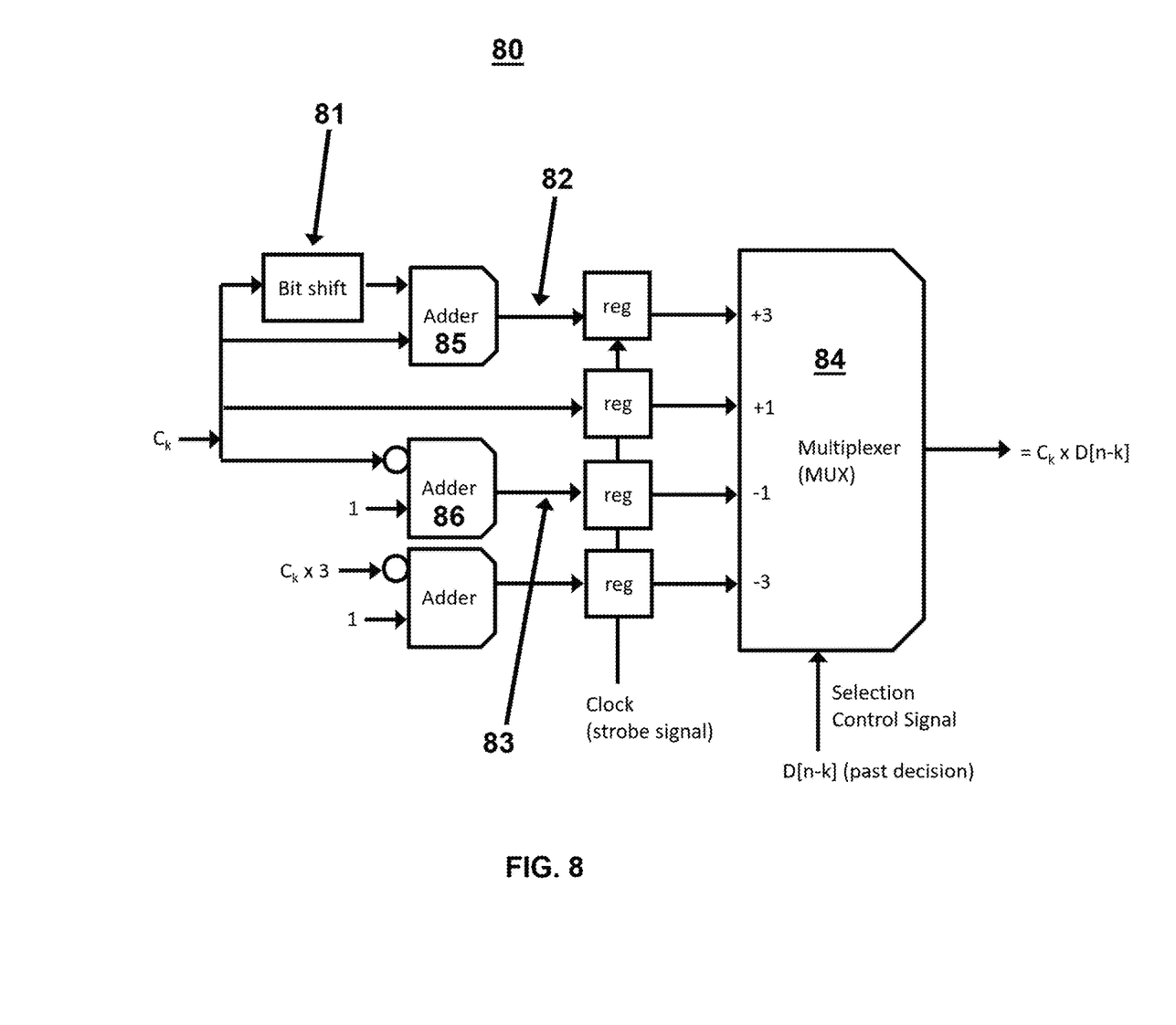
FIG. 8 is a circuit diagram of a system for implementing a PAM4 DFE according to another embodiment of the invention.

FIG. 8 is a circuit diagram of a system 80 for implementing a PAM4 DFE according to another embodiment of the invention. This circuit advantageously avoids full multiplication each clock cycle, avoids excessive power consumption, and may be relatively easy to implement by operation at low speed. As shown in the diagram, only 3 adders are required, and the MUX 84 is the only device that requires dynamic power during operation. Bit shift block 81 does a multiply-by-2, by shifting all the digital bits to the left and padding with a "0". The output 82 of the Adder 85 is given by Ck×3=Ck×(2+1)=Ck×2+Ck. At the output 83 of the Adder 86: calculate 2's complement=Invert Ck (denoted by the circle) and add 1=−Ck. Thus, the circuit 80 multiplies Ck by D[n-k], where D[n-k] is one of 4 values {+3, +1, -1, -3}, k is the k-th coefficient, and [n-k] is the past decision index.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method to implement hybrid signal processing, the method comprising:
   receiving an analog signal at a receiver frontend;
   sampling the received analog signal and storing the analog sampled signals using a plurality of sampling circuitries inside the receiver frontend;
   processing the plurality of analog sampled signals at a plurality of interleaved feedforward equalizers (FFEs) to provide a plurality of FFE interleaved sampled signal values corresponding to each of the plurality of the sampling circuitries;
   processing the plurality of analog sampled signals at an interleaved Decision Feedback Equalizer (DFE) to obtain a plurality of DFE interleaved sampled signal values;
   summing each of the FFE interleaved sampled signal values with a corresponding output from one of the DFE interleaved sampled signal values to provide a plurality of equalizer output signal values; and
   digitizing the plurality of equalizer output signals to provide digital data bits corresponding to each of the plurality of equalizer output signal values.

2. The method of claim 1, wherein the analog signal is a continuous time-varying signal representing a pulse amplitude modulated signal.

3. The method of claim 1, further comprising sampling the received analog signal at a sampling rate of 25G samples per second or higher.

4. The method of claim 1, wherein the plurality of sampling circuitries receive and sample the received analog signal in parallel.

5. The method of claim 1, wherein each sampling circuitry further comprising a Track-and-Hold (TAH) circuitry connected in series to a sample-and-hold (SAH) circuitry and configured to receive and hold a sampled signal value at the TAH circuitry during a first clock indicator and to transmit the sampled signal value to the SAH circuitry at a subsequent clock indicator.

6. The method of claim 5, wherein the TAH tracks the received analog signal when the clock indicator is high and then holds the sampled signal value when the clock indicator is low.

7. The method of claim 5, wherein processing the plurality of sampled-and-held signals further comprises determining a weighted sum of the samples from the SAH circuitries.

8. The method of claim 1, further comprising digitizing the plurality of equalizer output signals at an interleaved M-bit Analog-to-Digital Converter (ADC), where M is a non-zero positive integer.

9. The method of claim 1, further comprising digitizing the plurality of equalizer output signals to provide a digitized value corresponding to each of the plurality of equalizer output signal values.

10. The method of claim 1, wherein the digitizing the plurality of equalizer output signals further comprises processing the plurality of equalizer output signals with an Analog-to-Digital converter to provide digital data bits corresponding to each of the plurality of equalizer output signal values.

11. At least one non-transitory machine-readable medium comprising instructions that, when executed by computing software, including a processor coupled to a memory circuitry, cause a communication system to:
   receive an analog signal at a receiver frontend;
   sample the received analog signal and store the analog sampled signals using a plurality of sampling circuitries inside the receiver frontend;
   process the plurality of analog sampled signals at a plurality of interleaved feed-forward equalizers (FFEs) to provide a plurality of FFE interleaved sampled signal values corresponding to each of the plurality of the sampling circuitries;
   process the plurality of analog sampled signals at an interleaved Decision Feedback Equalizer (DFE) to obtain a plurality of DFE interleaved sampled signal values;
   sum each of the FFE interleaved sampled signal values with a corresponding output from one of the DFE interleaved sampled signal values to provide a plurality of equalizer output signal values; and
   digitize the plurality of equalizer output signals to provide digital data bits corresponding to each of the plurality of equalizer output signal values.

12. The machine-readable medium of claim 11, wherein the analog signal is a continuous time-varying signal representing a pulse amplitude modulated signal.

13. The machine-readable medium of claim 11, further comprising sampling the received analog signal at a sampling rate of 25G samples per second or higher.

14. The machine-readable medium of claim 11, wherein the plurality of sampling circuitries receive and sample the received analog signal in parallel.

15. The machine-readable medium of claim 11, wherein each sampling circuitry further comprising a Track-and-Hold (TAH) circuitry connected in series to a sample-and-hold (SAH) circuitry and configured to receive and hold a sampled signal value at the TAH circuitry during a first clock indicator and to transmit the sampled signal value to the SAH circuitry at a subsequent clock indicator.

16. The machine-readable medium of claim 15, wherein the TAH tracks the received analog signal when the clock indicator is high and then holds the sampled signal value when the clock indicator is low.

17. The machine-readable medium of claim 15, wherein processing the plurality of sampled-and-held signals further comprises determining a weighted sum of the samples from the SAH circuitries.

18. The machine-readable medium of claim 11, further comprising digitizing the plurality of equalizer output signals at an interleaved M-bit Analog-to-Digital Converter (ADC), where M is a non-zero positive integer.

19. The machine-readable medium of claim 11, further comprising digitizing the plurality of equalizer output signals to provide a digitized value corresponding to each of the plurality of equalizer output signal values.

20. The machine-readable medium of claim 11, wherein the digitizing the plurality of equalizer output signals further comprises processing the plurality of equalizer output signals with an Analog-to-Digital converter to provide digital data bits corresponding to each of the plurality of equalizer output signal values.

21. The machine-readable medium of claim 11, wherein the communication system is implemented as a System-on-Chip having an integrated receiver frontend.

22. A hybrid communication system, comprising:
   a receiver frontend to receive an analog signal;
   a plurality of sampling circuities to sample the received analog signal;
   a plurality of interleaved feed-forward equalizers (FFEs) to receive and process the analog sampled signals to provide a plurality of FFE interleaved sampled signal values corresponding to each of the plurality of the sampling circuitries;

an interleaved Decision Feedback Equalizer (DFE) to process the plurality of analog sampled signals to obtain a plurality of DFE interleaved sampled signal values;

a summer to sum each of the FFE interleaved sampled signal values with a corresponding output from one of the DFE interleaved sampled signal values to provide a plurality of equalizer output signal values; and an analog-to-digital converter (ADC) to digitize the plurality of equalizer output signals to provide digital data bits corresponding to each of the plurality of equalizer output signal values.

23. The system of claim 22, wherein the communication system is implemented as a System-on-Chip (SoC).

24. The system of claim 22, wherein the plurality of sampling circuities are further configured to store the analog sampled signals.

25. The system of claim 22, wherein the plurality of sampling circuitries are configured inside the receiver frontend.

26. The system of claim 22, wherein the analog signal is a continuous time-varying signal representing a pulse amplitude modulated signal.

27. The system of claim 22, wherein the sampling circuities sample the received analog signal at a sampling rate of 25G samples per second or higher.

28. The system of claim 22, wherein the plurality of sampling circuitries receive and sample the received analog signal in parallel.

29. The system of claim 22, wherein each of the sampling circuitries further comprises a Track-and-Hold (TAH) circuitry connected in series to a sample-and-hold (SAH) circuitry, each TAH configured to receive and hold a sampled signal value at the TAH circuitry during a first clock indicator and to transmit the sampled signal value to the SAH circuitry at a subsequent clock indicator.

30. The system of claim 29, wherein the TAH tracks the received analog signal when the clock indicator is high and then holds the sampled signal value when the clock indicator is low or vice versa (low and high).

31. The system of claim 29, further comprising a weighing circuitry to calculate a weighted sum of the samples from the SAH circuitries.

32. The system of claim 22, wherein the ADC comprises an interleaved M-bit Analog-to-Digital Converter (ADC) to digitize the plurality of equalizer output signals, where M is a non-zero positive integer.

33. The system of claim 32, wherein the interleaved M-bit ADC provides a plurality of digitized value corresponding to each of the plurality of equalizer output signal values.

* * * * *